United States Patent [19]

Oliveri et al.

[11] Patent Number: 4,902,632

[45] Date of Patent: Feb. 20, 1990

[54] METHOD OF PREVENTING SUPERFICIAL ELECTRICAL DISCHARGES IN CHIPS OF SEMICONDUCTOR DEVICES DURING TESTING

[75] Inventors: Carmelo Oliveri, Castiglione Di Sicilia - Catania; Carmelo Magro, Catania, both of Italy

[73] Assignee: SGS-Thomson Microelectronics S.r.l., Agrate Brianza (Milano), Italy

[21] Appl. No.: 288,407

[22] Filed: Dec. 21, 1988

[30] Foreign Application Priority Data

Dec. 22, 1987 [IT]  Italy ................................. 6632 A/87

[51] Int. Cl.$^4$ ...................... H01L 21/66; G01R 31/26
[52] U.S. Cl. ........................................ 437/8; 437/235; 437/941

[58] Field of Search .......................... 437/8, 941, 235; 324/158 T

[56] References Cited

U.S. PATENT DOCUMENTS 3,931,026  1/1976  Berkner ............................... 524/423
4,692,557  9/1987  Samuelson et al. ................. 136/251

*Primary Examiner*—Olik Chaudhuri
*Attorney, Agent, or Firm*—Herbert Dubno

[57] ABSTRACT

The method consists of subjecting the semiconductor chips to chemical treatment with a silanizing agent immediately before testing to prevent superficial electrical discharges which can reduce the testing voltage which can be applied.

2 Claims, No Drawings

METHOD OF PREVENTING SUPERFICIAL ELECTRICAL DISCHARGES IN CHIPS OF SEMICONDUCTOR DEVICES DURING TESTING

FIELD OF THE INVENTION

This invention relates to a method for preventing the occurrence of superficial electrical discharges in the chips of semiconductor devices during testing.

BACKGROUND OF THE INVENTION

The final phase in the manufacture of semiconductor devices and especially of planar, mesa and MOS power devices consists of voltage testing on wafer.

The automatic equipment used for this purpose is very often prevented from operating properly by the occurrence of superficial electrical discharges.

This problem is currently avoided by using a testing voltage lower than that at which the device is designed to operate and by putting off the testing at the maximum operating voltage until after the device has been fitted into a plastic or metal casing.

In this way, however, the percentage of rejects gives rise to a heavier economic impact since the loss involves not only the cost of the device on the wafer but also the cost pertaining to its assembly.

OBJECT OF THE INVENTION

It is an object of the invention to provide a method which considerably improves the possibility of testing the chips at the maximum operating voltages envisaged for the finished semiconductor devices.

DESCRIPTION OF THE INVENTION

The method of the invention consists in subjecting the chips to chemical treatment with a silanizing agent immediately before testing.

According to a preferred embodiment, the treatment is carried out by dipping the chip in a hydroalcoholic solution of 3-aminopropyltriethoxysilanol (3-APS), at a concentration ranging from 0.1 to 0.5% by volume.

The features of the invention will be more clearly evident from the following description of a non-restrictive example.

SPECIFIC EXAMPLE

A 95%/5% by volume solution of methyl alcohol and deionized $H_2O$ is prepared and 0.1% by volume of 3-APS is added. The chips are then immersed for about 10 minutes in this solution, after which they are rinsed in deionized $H_2O$ and then dried in a centrifuge, ready to be subjected to testing.

As pointed out previously, the proposed treatment makes it possible to considerably improve the possibilities of testing the chip at voltages equal to the peak operating voltages. This offers the following further advantages:

greater productivity of the automatic testing equipment, which is no longer disturbed (or is disturbed to a considerably lesser degree) by the superficial discharges occurring on the wafers;

increasing output yield of the finished devices during the electrical test; and the possibility of obtaining chips which, since they have been previously tested at operating voltages, can be marketed for subsequent assembly in hybrid circuits.

The effect of preventing electrical discharges that is achieved through the proposed method can be explained as follows.

The occurrence of electrical discharges during the testing of the chips can depend upon various causes. One of the most important of these is the hygroscopic nature and gettering (of external contaminants) properties of the passivating film normally present on the chip which is the result of chemical deposition from vitreous silicate vapors.

These characteristics of the passivating film correspond to unsaturated chemical bonds on the surface which can lead to the formation of ion pairs.

The treatment according to the invention has the effect of chemically blocking the reactive and unstable superficial ion bonds by forming covalent type bonds. In fact, when the chips are treated with silanizing agents, ethereal Si—O—Si type bonds are formed in the superficial atomic layers where Si—O—/X+ type bonds previously existed.

(When 3-APS is used as the silanizing agent, the simplified formula of the reaction is as follows:

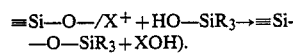

This leads to the formation of stable, non ionizable, covalent bonds which prevent the possibility of superficial electrical conduction.

We claim:

1. A method of preventing the occurrence of superficial electrical discharges in the chips of semiconductor devices during testing, which comprises subjecting the chips to chemical treatment with a silanized agent immediately before testing.

2. The method defined in claim 1 wherein the treatment is carried out by dipping the chips in a hydroalcoholic solution of 3-aminopropyltriethoxysilanol (3-APS, at a concentration ranging from 0.1 to 0.5% in volume.

* * * * *